United States Patent
Haitani

(10) Patent No.: US 6,804,076 B2
(45) Date of Patent: Oct. 12, 2004

(54) METHOD AND DEVICE FOR ENTERING TEST MODE IN AN INTEGRATED CIRCUIT FOR USE IN A FLOPPY DISK DRIVE, AND A FLOPPY DISK DRIVE APPARATUS INCORPORATING THE METHOD

(75) Inventor: Munehisa Haitani, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 226 days.

(21) Appl. No.: 09/804,177

(22) Filed: Mar. 12, 2001

(65) Prior Publication Data

US 2001/0024338 A1 Sep. 27, 2001

(30) Foreign Application Priority Data

Mar. 14, 2000 (JP) ........................................ 2000-071235

(51) Int. Cl.⁷ .................... G11B 15/12; G11B 27/36; G11B 5/09
(52) U.S. Cl. .................... 360/61; 360/31; 360/53
(58) Field of Search .................... 360/97, 113, 51, 360/48, 53, 31, 61

(56) References Cited

U.S. PATENT DOCUMENTS

| | | |
|---|---|---|
| 4,709,279 A | 11/1987 | Sano et al. |
| 4,929,894 A | 5/1990 | Monett |
| 5,245,577 A | 9/1993 | Duesman et al. |
| 5,408,435 A | 4/1995 | McClure et al. |
| 5,826,007 A | 10/1998 | Sakaki et al. |
| 6,262,857 B1 * | 7/2001 | Hull et al. .................... 360/51 |
| 6,341,045 B1 * | 1/2002 | Hironaka et al. ............. 360/48 |

FOREIGN PATENT DOCUMENTS

| | | |
|---|---|---|
| GB | 2 324 613 A | 10/1998 |
| JP | 1-185885 | 7/1989 |

* cited by examiner

Primary Examiner—David Hudspeth
Assistant Examiner—Glenda P Rodriguez
(74) Attorney, Agent, or Firm—Brinks Hofer Gilson & Lione

(57) ABSTRACT

A method and a device enters a test mode in a floppy disk drive integrated circuit. The method and device includes a monitoring circuit and an integrated circuit having a selecting circuit. The selecting circuit selects a test-mode when a test mode command is received and a steady state voltage level is reached in a predetermined time period.

14 Claims, 4 Drawing Sheets

| CIRCUIT BLOCK | TEST MODE ENTERING PERIOD | TEST MODE | NORMAL MODE |
|---|---|---|---|
| POWER SUPPLY VOLTAGE MONITORING UNIT | IN OPERATION | IN OPERATION | IN OPERATION |
| CLOCK CIRCUIT | IN OPERATION | IN OPERATION | IN OPERATION |
| TEST/NORMAL MODE SELECTING CIRCUIT | IN OPERATION | IN OPERATION | NOT IN OPERATION |
| CONTROL CIRCUIT | NOT IN OPERATION | IN OPERATION | IN OPERATION |

METHOD AND DEVICE FOR ENTERING TEST MODE IN AN INTEGRATED CIRCUIT FOR USE IN A FLOPPY DISK DRIVE, AND A FLOPPY DISK DRIVE APPARATUS INCORPORATING THE METHOD

BACKGROUND

1. Technical Field

The present invention relates to a method and a device for entering a test mode in a Floppy Disk Drive (FDD). More particularly, the present invention relates to a method for entering a test mode using an Integrated Circuit (IC) within an FDD apparatus in which the IC enters the test mode upon input of a test-mode command and to an FDD apparatus incorporating the method.

2. Related Art

For the purpose of inspection, a test mode is provided within an IC incorporated in a FDD. Entry into the test mode occurs by entering a test command in a dedicated input terminal or applying a digital signal to an input terminal of the FDD apparatus. In carrying out the inspection, the FDD apparatus should not enter the test mode when operating in a normal mode. In some ICs, however, noise signals can cause the FDD apparatus to enter the test mode unexpectedly.

SUMMARY

One aspect of the present invention provides a method and a device for entering a test mode in an Integrated Circuit (IC) used in a Floppy Disk Drive (FDD) apparatus. The IC prevents the FDD from entering a test mode when operating in a normal mode even in the event of receiving an enabling command, such as an enter-test-mode command or a signal coinciding with such a command. In another aspect, the invention provides an FDD apparatus incorporating the method and the device. According to this aspect, the IC enters the test mode when the IC receives the enabling command within a predetermined period of time after the FDD apparatus is powered up at a steady state voltage. The IC enters the test mode only when an enabling command is received during a pre-operation period that preferably occurs when the FDD apparatus is powered up and the FDD apparatus has not begun normal operation. Therefore, the IC prevents the FDD apparatus from unexpectedly entering the test mode while operating in a normal mode even if the enabling command or the signal coinciding therewith is received.

Preferably, the FDD IC enters a normal mode when the predetermined time period lapses, unless the enabling command is received within the predetermined time period and the disk drive is powered up to a steady state. If the test mode command is not received within this predetermined time period, the FDD automatically enters a normal mode ensuring the stable operation of the FDD apparatus. Preferably, the predetermined time period begins after a power supply voltage and a clock frequency have stabilized and the enabling command is stably received. Thus, the IC enters the test mode stably and securely.

According to another aspect, the device for entering a test mode in an FDD apparatus comprises a selecting circuit, unitary with, integrated within, or interfaced to the FDD IC. Preferably, the selecting circuit initiates the test mode when an enabling command is received within the predetermined period and the FDD is powered up to the steady state. Thus, the IC prevents the FDD from accidentally entering the test mode.

According to yet another aspect, an FDD includes an FDD IC. The FDD IC enters a test mode when an enabling command is received within a predetermined time period and the FDD is powered up. A spindle motor driven by a motor driver is controlled by the FDD IC when the FDD is operating in a normal mode. A head that reads data from and writes data to a media such as a floppy disk is driven by the spindle motor. Preferably, a stepping motor actuates the head. The IC is prevented from entering the test mode when operating in a normal mode.

DESCRIPTION OF THE PREFERRED EMBODIMENTS

Figure 1:
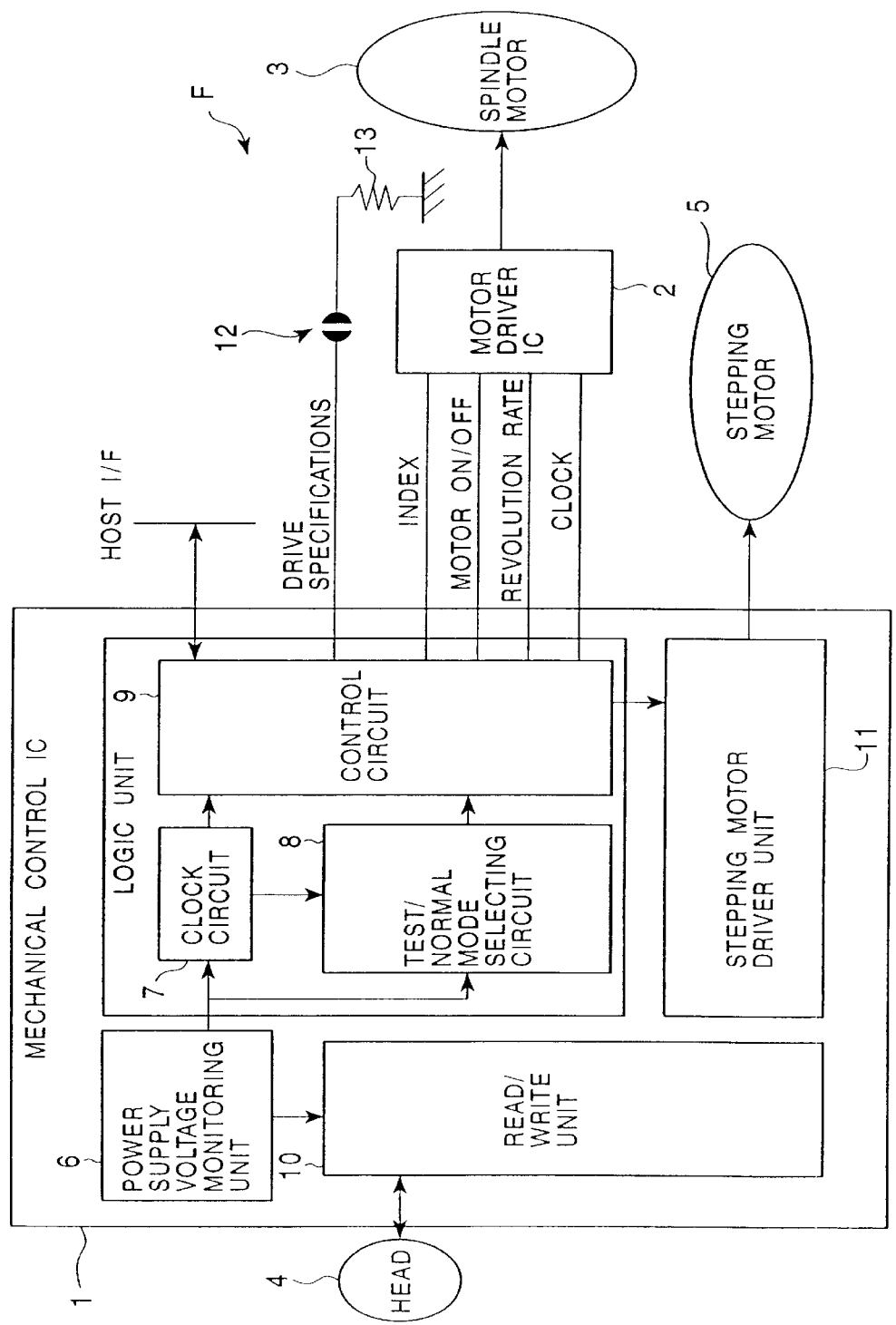
FIG. 1 is a block diagram of an embodiment of FDD apparatus.
Figure 2:
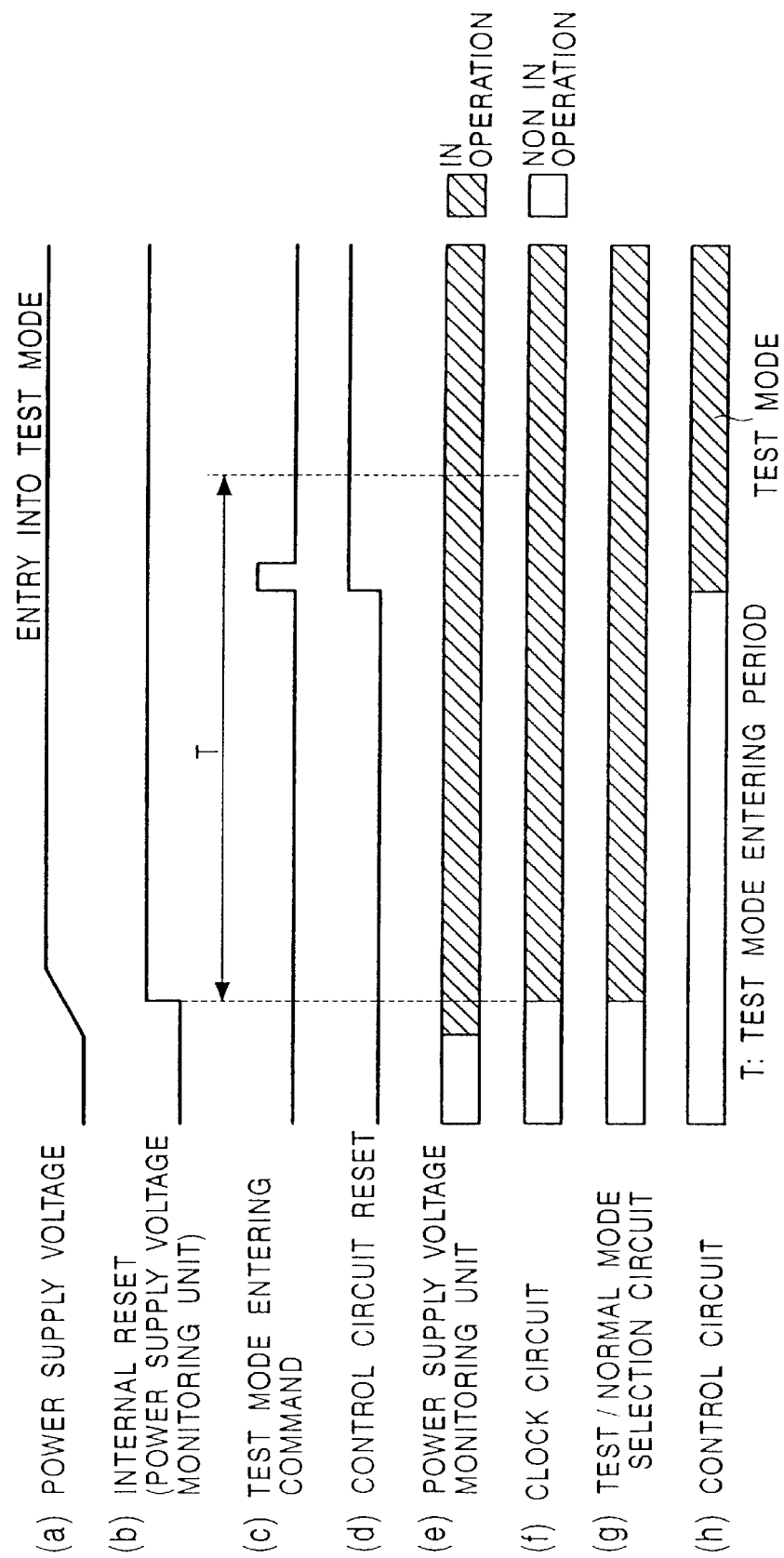
FIG. 2 is a timing diagram showing the status of each of the blocks of FIG. 1 when the IC enters the test mode.
Figure 3:
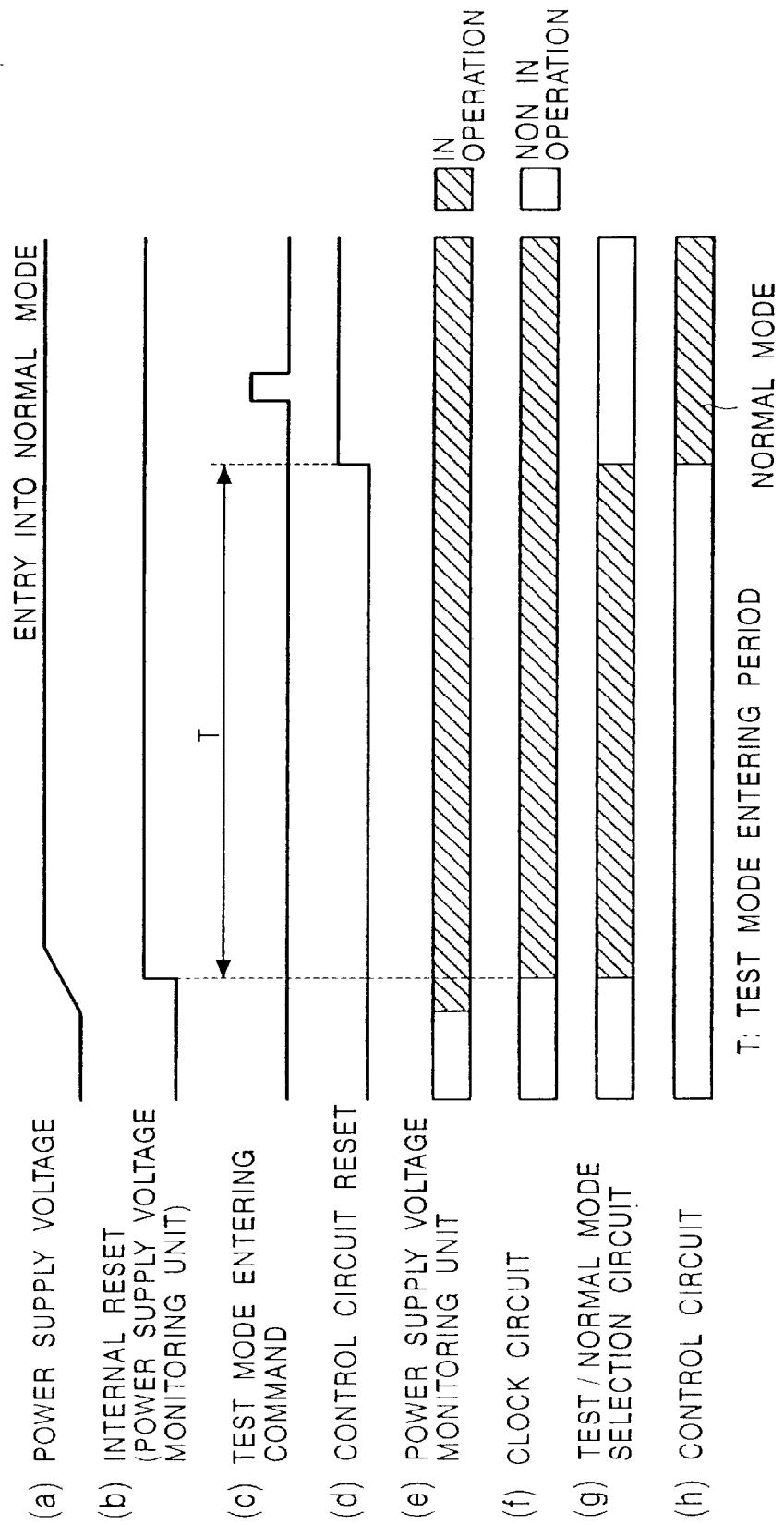
FIG. 3 is a timing diagram showing the status of each of the blocks of FIG. 1 when the IC enters a normal mode.

FIG. 1 is a diagram of an FDD apparatus in which a method for entering a test mode is implemented. FIGS. 2 and 3 are timing diagrams of the status of each of the system blocks of an IC entering a test mode and a normal mode, respectively.

Referring to FIG. 1, an embodiment of an FDD apparatus includes a mechanical control IC 1, coupled to a host via a host I/F, a motor driver IC 2 which is preferably driven by the mechanical control IC 1, a spindle motor 3, preferably driven by the motor driver IC 2, a head 4 that preferably reads data from and writes data to a Floppy Disk (FD) and a stepping motor 5 that preferably actuates the head 4 with a high precision.

The mechanical control IC 1 includes a power supply voltage monitoring unit 6 for continuously monitoring the power supply voltage supplied to each of the components of the mechanical control IC 1 and a clock circuit 7. The clock circuit 7 preferably generates clock signals that preferably synchronize the components. A test/normal mode selecting circuit 8 preferably manages the operation of a control circuit 9 between a test mode and a normal mode.

The control circuit 9 preferably generates control signals that are used to control the motor driver IC 2 that drives the spindle motor 3 on and off in response to external instructions, and for changing the rotation rates and conditioning the clock signals. The control circuit 9 also receives from the spindle motor 3 via the motor driver IC 2 index signals that determine the starting position of data writes on the FD. The control circuit 9 forwards the signals to the host via the host I/F.

The mechanical control IC 1 further includes a read/write unit 10 that controls the head 4 to read data from and write data to the FD. Preferably, the head 4 can be electrically controlled to read data from or write data to a media or a recording surface. The mechanical control IC 1 also includes a stepping motor driver unit 11 which under control of the control circuit 9, controls the stepping motor 5. A jumper land 12 is coupled between the control circuit 9 and an electrical ground that sets the specification of the disk drive to the type of FD. A resistor 13 is provided between the jumper land 12 and the electrical ground.

Operation of the FDD apparatus is described with reference to the timing diagrams of FIGS. 2 and 3. Referring to FIG. 2, when a power switch is turned on, as in (a), a power supply voltage is supplied to each of the components of the mechanical control IC 1, and the power supply voltage monitoring unit 6 is internally reset, as shown in (b). The power supply voltage monitoring unit 6 and the clock circuit 7 continue to operate after the power supply switch is turned on, as shown in (e) and (f). If a hidden enabling command, such as an enter-test-mode command is received within a predetermined time period T and the power supply switch is at a steady state, as shown in (c), the test/normal mode selecting circuit 8 selects and latches the test mode. With the test mode latched, the control circuit 9 is released from a reset state, as shown in (d). At this time, the test/normal mode selecting circuit 8 is still operating, as shown in (g). The control circuit 9 starts operating in the test mode as shown in (h), allowing the IC used in FDD apparatus to undergo inspection by an IC tester.

Referring to FIG. 3, if an enabling command, such as a hidden enter-test-mode command is not received within the predetermined time period T, the power supply voltage monitoring unit 6 and the clock circuit 7 continue to operate, as shown in (e) and (f). However, the test/normal mode selecting circuit 8 selects and latches the normal mode, and then enables the operation of the control circuit 9, as shown in (d). At this time, the test/normal mode selecting circuit 8 shuts down or stops operating, as shown in (g). The control circuit 9 begins operating in the normal mode, as shown in (h), and the IC used in the FDD apparatus functions by reading data from or writing data to the FD. Even if a hidden enter-test-mode command is received after the predetermined time period T has lapsed, the command is ignored, disabling the test mode, and thereby preventing erroneous operation of the FDD apparatus.

Figures 4, 5:
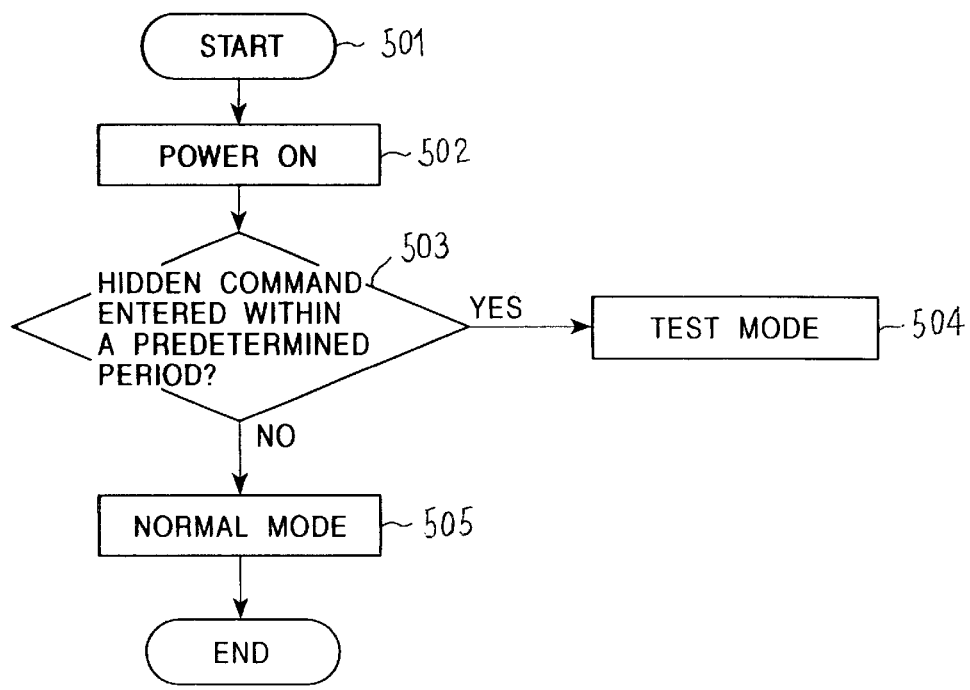
FIG. 4 is a truth table showing the status of each of the blocks in FIG. 1.
FIG. 5 is a flow chart of a method for entering the test mode.

FIG. 4 shows the status of the power supply voltage monitoring unit 6, the clock circuit 7, the test/normal mode selecting circuit 8, and the control circuit 9 when entering the test mode period, during the test mode operation, and during normal operation.

FIG. 5 is a flow chart illustrating the method of entering the test mode. Referring to FIG. 5, the FDD apparatus is activated at act 501. At act 502, the power supply monitoring circuit monitors the input voltage until a steady state voltage is reached. At act 503, a selecting circuit or selecting means determines whether a test-mode command was received within a predetermined time period T. If the test mode command is detected within the predetermined time period T, an IC used in the FDD apparatus enters a test mode in act 504. The test mode may sustain for a predetermined time period or sustain only while the test mode command is detected and the input voltage and the clock frequency remain at a steady state. If the predetermined time period T lapses without detecting the test mode command, the IC used in the FDD apparatus enters the normal mode in act 505.

It should be apparent that the read/write head 4 is not limited to a mechanism that detects or creates changes in magnetic fields on an FD. In alternative embodiments, the system and method may be used with any device that stores data, such as laser disks and/or optical disks. The invention also is not limited to an electromechanical or any other hardware or software configuration. Any suitable structure, including a programmable integrated circuit or other hardware and software combinations may implement the invention. The invention may also be integrated within or made unitary to a standalone device that reads and/or writes data.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for entering a test mode in a circuit that is a unitary part of a disk drive, comprising:
   supplying voltage to a disk drive;
   monitoring the voltage until a steady state voltage is reached;
   monitoring an input of a test mode circuit for a test-mode command;
   initiating a test mode in the disk drive only when the test-mode command is detected, and the steady state voltage level is reached in a predetermined time period; and
   disabling the test-mode if the test-mode command is not detected within the predetermined time period.

2. The method of claim 1, further comprising operating the disk drive in the normal mode when the test-made command is not detected.

3. The method as in claim 2, further comprising ignoring the test-mode command if the test-mode command is received when the disk is operating in the normal mode.

4. The method of claim 1, wherein said predetermined time period occurs when the power supply voltage is at the steady state, a clock frequency is at a steady state, and the test-mode command is detected.

5. The method of claim 1 wherein the disk drive is a floppy disk drive.

6. The method as in claim 1, wherein the predetermined time period is initiated by an internal reset.

7. A device for initiating a test mode in a disk drive, comprising:
   a monitoring circuit configured to identify a steady state voltage level;
   a selecting circuit configured to select a test mode only when a test mode command is detected in a predetermined time period and the monitoring circuit identifies the steady state voltage level in the predetermined time period; and
   a control circuit interfaced to the selecting circuit and the disk drive, the control circuit being configured to initiate a test-mode when the selecting circuit selects the test mode; wherein the selecting circuit is configured to shut down if the test-mode command is not detected in the predetermined time period.

8. The device of claim 7 wherein the selecting circuit selects the test mode when the test mode command is received in the predetermined time period.

9. The device of claim 7 wherein the device is a floppy disk drive.

10. The device of claim 7, wherein the control circuit is configured to initiate and maintain an operating mode if the test-mode command is detected outside of the predetermined time period.

11. A disk drive, comprising:

a monitoring circuit configured to monitor an input voltage and detect a steady state voltage level;

a disk drive circuit interfaced to the monitoring circuit, the disk drive circuit being configured to initiate a test-mode in a timed period only if the steady state voltage level is reached and the disk drive circuit receives a test-mode command in a predetermined time period;

a motor interfaced to the disk drive circuit; and a head configured to read data from and write data to a media driven by the motor in a normal mode even it a test-mode is received outside of the predetermined time period.

12. The device of claim 11 wherein the device is a floppy disk drive.

13. The device of claim 11, wherein the disk drive circuit comprises a latch that is used to maintain the normal mode state or the test-mode state.

14. The device of claim 13, wherein the disk drive further comprises a selecting circuit configured to shut down if the test-mode command is not detected in the predetermined time period.

* * * * *

UNITED STATES PATENT AND TRADEMARK OFFICE
CERTIFICATE OF CORRECTION

PATENT NO.    : 6,804,076 B2
DATED         : October 12, 2004
INVENTOR(S)   : Munehisa Haitani It is certified that error appears in the above-identified patent and that said Letters Patent is hereby corrected as shown below:

Column 4,
Line 42, after "when the" delete "test-made" and substitute -- test-mode -- in its place.

Column 6,
Line 6, after "mode even" delete "it" and substitute -- if -- in its place.

Signed and Sealed this

Thirteenth Day of December, 2005

JON W. DUDAS
*Director of the United States Patent and Trademark Office*